United States Patent
Kawanoue et al.

(10) Patent No.: US 6,348,402 B1
(45) Date of Patent: *Feb. 19, 2002

(54) METHOD OF MANUFACTURING A COPPER INTERCONNECT

(75) Inventors: Takashi Kawanoue, Yokohama; Tetsuo Matsuda, Tano-gun; Hisashi Kaneko, Fujisawa; Tadashi Iijima, Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/526,880

(22) Filed: Mar. 16, 2000

(30) Foreign Application Priority Data

Mar. 18, 1999 (JP) .......................................... 11-073486

(51) Int. Cl.⁷ ...................... H01L 21/4763; H01L 21/44
(52) U.S. Cl. ..................... 438/618; 438/627; 438/637; 438/653; 438/685; 438/702
(58) Field of Search ................................ 438/618, 627, 438/635, 643, 653, 637, 658, 648, 656, 660, 663, 685, 694, 695, 702

(56) References Cited

U.S. PATENT DOCUMENTS

| | | | |
|---|---|---|---|
| 5,130,274 A | | 7/1992 | Harper et al. ................ 438/624 |
| 5,236,869 A | * | 8/1993 | Takagi et al. ................ 438/635 |
| 5,783,483 A | * | 7/1998 | Gardner ........................ 438/627 |
| 5,989,999 A | * | 11/1999 | Levine et al. ............... 438/627 |
| 6,008,127 A | * | 12/1999 | Yamada ....................... 438/694 |
| 6,139,697 A | * | 10/2000 | Chen et al. .................. 427/250 |

FOREIGN PATENT DOCUMENTS

JP 10-116831 5/1998

OTHER PUBLICATIONS

Kirchner et al.; Mat. Res. Soc. Symp. Proc.; 1994 vol. 318 pp. 319–322.*

Kirchner et al., "Ultra Thin Sacrificial Diffusion Barriers–Control of Diffusion Across the Cu–SiO$_2$ Interface," *Mal. Res. Soc. Symp. Proc.*, Abstract (1994).

* cited by examiner

Primary Examiner—Matthew S. Smith
Assistant Examiner—Igwe U. Anya
(74) Attorney, Agent, or Firm—Finnegan, Henderson, Farabow, Garrett, & Dunner, L.L.P.

(57) ABSTRACT

A groove or hole is formed in an insulating layer formed on a semiconductor substrate, and a first conductive layer including a first metal element is formed on a surface of the insulating layer. By oxidizing the first conductive layer, an oxide layer of the first metal element is formed on a surface of the first conductive layer. A second conductive layer including a second metal element having a free energy of oxide formation lower than that of the first metal element is deposited thereon. By reducing the oxide layer of the first metal element by the second metal element, an oxide layer of the second metal element is formed at the interface between the first conductive layer and the second conductive layer. Further, an interconnection is buried in the groove or hole of the insulating layer. Thereby, a thin second metal oxide layer having excellent barrier properties against an interconnection material and excellent adhesion to the interconnection material can be selectively formed with a uniform thickness on the surface of the first conductive layer used as a barrier metal layer of the interconnection.

21 Claims, 3 Drawing Sheets

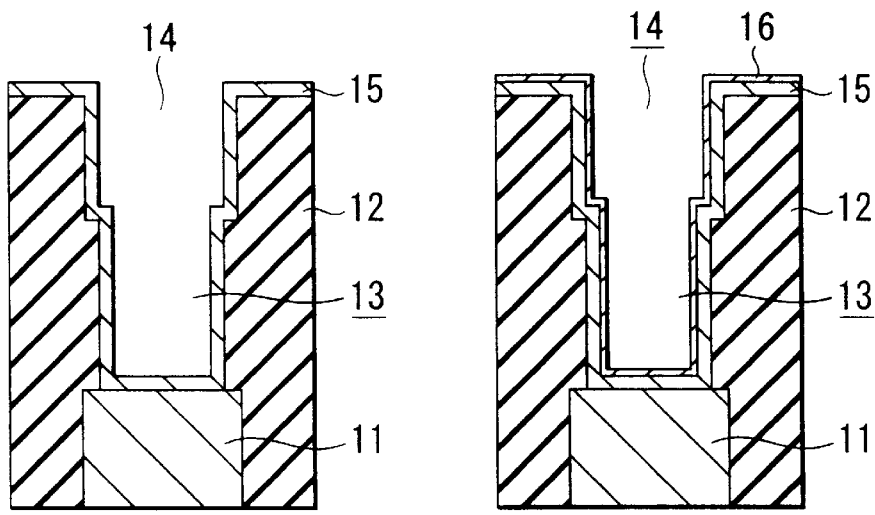
FIG. 1
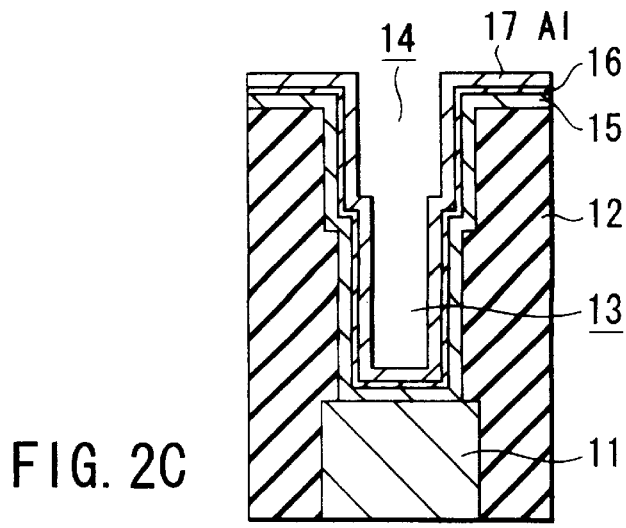
FIG. 2A  FIG. 2B
FIG. 2C

METHOD OF MANUFACTURING A COPPER INTERCONNECT

CROSS-REFERENCE TO RELATED APPLICATIONS

This application is based upon and claims the benefit of priority from the prior Japanese Patent Application No. 11-073486, filed Mar. 18, 1999, the entire contents of which are incorporated herein by reference.

BACKGROUND OF THE INVENTION

The present invention relates to a method of manufacturing a semiconductor device comprising a barrier metal for suppressing diffusion of interconnection material.

It is known that diffusion barrier properties of a semiconductor device with respect to Al is improved by exposing a surface of a TiN layer, used as a barrier metal of the semiconductor device, to an oxidizing atmosphere. It is considered that this is because a Ti oxynitride layer having high barrier properties is formed along the surface and grain boundary of the TiN layer.

For example, a TiN film is deposited as a diffusion barrier in a contact hole through which an Al interconnection is to be connected to a diffusion layer formed in an Si substrate, and thereafter annealing (stuffing) is performed in an nitrogen atmosphere including a trace amount of oxygen. When an Al film is deposited thereafter, mutual diffusion of Al and Si due to heat treatments in the following steps can be effectively prevented.

Therefore, with respect to Cu damascene interconnection of a semiconductor device, there has been proposed a method of suppressing diffusion of Cu by forming a Ti oxide [$TiO_x$, $Ti(ON)_x$] on the surface or the grain boundary of the TiN layer, in the same manner as described above.

However, in this method, barrier properties of the TiN layer with respect to Cu diffusion is not sufficient, and there is a possibility of Cu diffusing into an insulating layer by heat treatments in manufacturing steps. There is a problem that adhesion strength between a Cu film and a TiN layer decreases due to presence of a Ti oxide at the interface between the Cu film and the TiN layer, which results in a failure in CMP process.

BRIEF SUMMARY OF THE INVENTION

The object of the present invention is to provide a method of manufacturing a semiconductor device which improves barrier properties against interconnection material, and is capable of suppressing occurrence of film separation failure in CMP process.

In order to achieve the above object, according to a first aspect of the present invention, there is provided a method of manufacturing a semiconductor device, comprising the steps of:

forming one of a groove and a hole in an insulating layer formed on a semiconductor substrate;

forming a first conductive layer including at least a first metal element on a surface of the insulating layer;

forming an oxide layer of the first metal element on a surface of the first conductive layer by exposing the first conductive layer to an oxidizing atmosphere;

depositing on a surface of the oxide layer of the first metal element a second conductive layer including at least a second metal element having a free energy of oxide formation lower than that of the first metal element;

forming an oxide layer of the second metal element at an interface between the first conductive layer and the second conductive layer by reducing the oxide layer of the first metal element by the second metal element; and burying an interconnection in the one of the groove and the hole in the insulating layer.

It is preferable that the method further comprises a step of selectively removing the second conductive layer, between the step of forming the oxide layer of the second metal element and the step of burying the interconnection in the one of the groove and the hole.

It is preferable that the method further comprises a step of removing the oxide layer of the second metal element formed on a bottom surface of the one of the groove and the hole while leaving the oxide layer of the second metal element formed on side surfaces of the one of the groove and the hole, between the step of forming the oxide layer of the second metal element and the step of burying the interconnection in the one of the groove and the hole.

It is preferable that the second metal element is Al.

It is preferable that the first metal element is an element selected from the group consisting of W, Ti, Ta and Nb, the first conductive layer is a nitride of the element selected from the group consisting of W, Ti, Ta and Nb, and the second metal element is Al.

The interconnection can be a Cu interconnection.

According to a second aspect of the present invention, there is provided a method of manufacturing a semiconductor device, comprising the steps of:

forming one of a groove and a hole in an insulating layer formed on a semiconductor substrate, the insulating layer including an oxide of a predetermined element;

forming on a surface of the insulating layer a first conductive layer including at least a first metal element having a free energy of oxide formation lower than that of the predetermined element;

forming an oxide layer of the first metal element at an interface between the insulating layer and the first conductive layer, by reducing the oxide of the predetermined element by the first metal element; and burying an interconnection in the groove or hole of the insulating layer.

It is preferable that the method further comprises a step of selectively removing the first conductive layer, between the step of forming the oxide layer of the first metal element and the step of burying the interconnection.

It is preferable that the first metal element is Al.

It is preferable that the predetermined element is Si, and the first metal element is Al.

It is preferable that the method further comprises a step of depositing a second conductive layer including at least a second metal element having a free energy of oxide formation higher than that of the first metal element, between the step of forming the oxide layer of the first metal element and the step of burying the interconnection.

It is preferable that the predetermined element is Si, the first metal element is Al, the second metal element is an element selected from the group consisting of W, Ti, Ta and Nb, and the second conductive layer is a nitride of the element selected from the group consisting of W, Ti, Ta and Nb.

The interconnection can be a Cu interconnection.

According to a third aspect of the present invention, there is provided a method of manufacturing a semiconductor device, comprising the steps of:

forming one of a groove and a hole in an insulating layer formed on a semiconductor substrate, the insulating layer including at least one element selected from the group consisting of boron, oxygen, carbon and nitrogen;

forming on a surface of the insulating layer a first conductive layer including at least a first metal element;

forming a layer of one selected from the group consisting of boride, oxide, carbide and nitride of the first metal element at an interface between the insulating layer and the first conductive layer, by reacting the one element selected from the group consisting of boron, oxygen, carbon and nitrogen with the first metal element; and burying an interconnection in the one of the groove and the hole of the insulating layer.

It is preferable that the method further comprises a step of selectively removing the first conductive layer, between the step of forming a layer of one selected from the group consisting of boride, oxide, carbide and nitride of the first metal element and the step of burying the interconnection.

It is preferable that the method further comprises a step of depositing a second conductive layer including at least a second metal element having a free energy of formation of the one selected from the group consisting of boride, oxide, carbide and nitride higher than that of the first metal element, between the step of forming the layer of one selected from the group consisting of boride, oxide, carbide and nitride of the first metal element and the step of burying the interconnection.

It is preferable that the interconnection is a Cu interconnection.

According to the present invention, on a surface of a first conductive layer used as a barrier metal layer of an interconnection, a thin second metal element oxide layer (for example, Al oxide) having excellent barrier properties, against interconnection material, can be selectively formed with a uniform thickness. Since an oxide layer having a high resistivity is formed thin, increase of an electrical resistance of the interconnection can be suppressed.

Further, a thin metal element oxide layer having excellent barrier properties against interconnection material can be selectively formed with a uniform thickness on a surface of an insulating layer including oxygen. Since no metal oxide layer is formed on a surface of groove or hole connected to the interconnection in an underlying layer through the insulating layer, increase of interconnection resistance is prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram comparing barrier properties of various kinds of oxides.

FIGS. 2A–2G are cross-sectional views showing stepwise a method of manufacturing an interconnection portion of a semiconductor device according to a first embodiment of the present invention.

DETAILED DESCRIPTION OF THE INVENTION

Figure 2D:
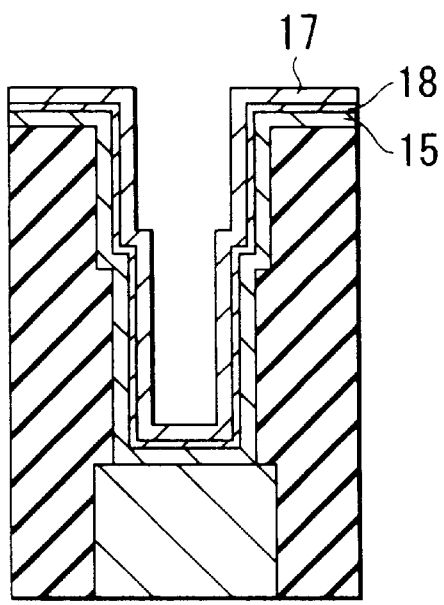

Before explaining embodiments of the present invention, the background of the present invention will now be described first.

As described afore, it is known that diffusion barrier properties are improved by exposing a surface of a TiN layer to an oxidizing atmosphere. This was considered owing to the fact that a Ti oxynitride layer having high barrier properties was formed along the surface and the grain boundary of the TiN layer. However, if the surface oxidation treatment of the TiN layer as described above is performed with respect to Cu, the barrier properties are not remarkably improved, unlike the diffusion barrier properties with respect to Al.

Therefore, the inventors of the present invention analyzed in detail the interface between Al and TiN the barrier properties of which were improved by the surface oxidation treatment. First, a TiN film with 20 nm thickness was deposited on a silicon oxide film by a formation sputtering method. Thereafter, annealing was performed while an $N_2$ gas including a trace amount of oxygen was made to flow over the surface of the TiN film to oxidize the surface, and a Ti oxide film was formed. Then, an Al film with 20 nm thickness was deposited on the Ti oxide film by a sputtering method, and annealing was performed in a ultra-high vacuum in a sputtering apparatus until island-like agglomerations were generated on the Al film. As the result of measuring a contact angle of agglomerated Al to the Ti oxide by a cross-section SEM, the contact angle was greatly different from that of Al on a Ti oxide, and close to the contact angle on an Al oxide.

Next, in order to examine the bonding state at the interface between the Al layer and the TiN layer, the interface was analyzed in the depth direction by X-ray photoelectron spectroscopy (XPS). As a result, a peak of Al—O bonding was found in the vicinity of the interface between the Al layer and the TiN layer.

From the above matters, the inventors of the present invention have reached the idea that the improvement of barrier properties of TiN against Al by the surface oxidation treatment of the TiN layer is obtained not because a Ti oxide is formed on the surface of the TiN layer, but because the Ti oxide is reduced by the interface reaction between the Ti oxide and Al thereafter and Al oxide having high barrier properties is formed at the interface.

The inventors attempted to evaluate barrier properties of oxides of various elements against Cu as follows. A silicon nitride film having 200 nm thickness was deposited on an Si substrate by an LPCVD method in order to prevent Cu diffusion into the substrate, and thereafter an amorphous silicon film having 100 nm thickness was deposited thereon by the LPCVD method. Thereafter, an Al oxide film, a Ta oxide film, an Nb oxide film, a W oxide film, a Ti oxide film or an Si oxide film having 5 nm thickness was deposited by a formation sputtering method, and a Cu film having 200 nm thickness was deposited thereon. A sample formed in such a manner was annealed in a vacuum at 450° C. for 4 hours or 16 hours, and the barrier properties of the oxide film was evaluated by the fraction of silicided area (silicidation rate) where Cu silicide was formed from Cu diffused from the Cu film into the amorphous silicon film via the oxide film. The evaluation result of the silicidation rate is shown in FIG. 1. In FIG. 1, "EXCELLENT" indicates that no silicide was formed, "GOOD" that a little silicide was formed, and "POOR" that much silicide was formed.

As shown in FIG. 1, Ta oxide, Nb oxide, W oxide or Ti oxide has high barrier properties against Cu in comparison with silicon oxide. However, it was confirmed that Al oxide has further higher barrier properties than those oxides.

Further, Al oxide also had an excellent degree of adhesion to Cu, and there was no possibility of separation of film during CMP process when a Cu buried interconnection was formed in a groove or hole in the following process.

Next, embodiments of the present invention will now be described with reference to the drawings.

[First Embodiment]

FIGS. 2A–2G are cross-sectional views showing stepwise a manufacturing process of a semiconductor device interconnection portion according to a first embodiment of the present invention.

First, as shown in FIG. 2A, in an insulating layer 12 formed to cover an interconnection 11, a via hole 13 to be connected to the interconnection 11 and an interconnection groove 14 to be connected to the via hole 13 are formed. In FIGS. 2A–2G, though the interconnection 11 and the insulating layer 12 are formed on a semiconductor substrate on which circuit elements are formed, the circuit elements and semiconductor substrate are not shown.

Next, a TiN layer 15 having 10 nm thickness is deposited on the whole surface by a long throw sputtering method. At this time, the TiN layer 15 is formed under such conditions that the layer 15 covers inner walls and a bottom surface of the via hole 13 and the interconnection groove 14.

Then, as shown in FIG. 2B, annealing (stuffing treatment) in a nitrogen atmosphere including a trace amount of oxygen is performed at 450° C. for 30 minutes to form a Ti oxide (TiO$_x$) layer 16 on the surface of the TiN layer 15.

Then, as shown in FIG. 2C, Al (a second metal element) having a free energy of oxide formation lower than that of Ti (a first metal element) is deposited by the long throw sputtering method, and thereby an Al layer 17 having 100 nm thickness is formed on the surface of the Ti oxide 16.

Thereafter, as shown in FIG. 2D, the Al layer 17 and the Ti oxide layer 16 are reacted with each other by performing vacuum anneal at 450° C. for 15 minutes, and an Al oxide (AlO$_x$) layer 18 having 1–3 nm thickness is formed at the interface between the Al layer 17 and the Ti oxide layer 16.

As described above, since Al has a free energy of oxide formation lower than that of Ti, the Ti oxide layer is reduced by Al by means of vacuum anneal and an Al oxide layer is formed.

Since the Al oxide layer 18 has excellent barrier properties as described above, diffusion of Cu included in a Cu interconnection to be formed later can be suppressed.

Figure 2E:
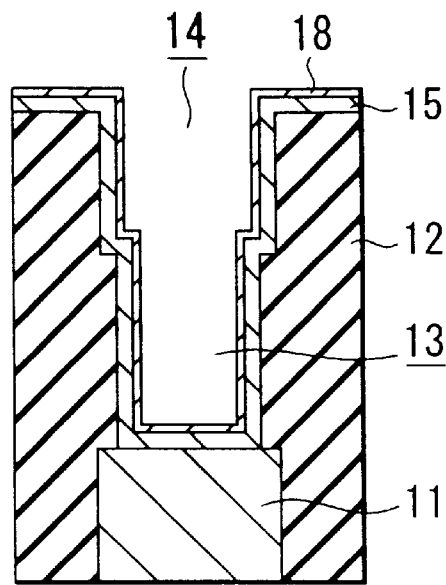

Next, as shown in FIG. 2E, the remaining, non-reacted Al layer 17 is removed by a wet-etching liquid mainly comprising phosphorous acid. Since the contact resistance between the underlying interconnection 11 and a Cu interconnection to be formed later, becomes high due to a high resistivity of the Al oxide layer 18, the Al oxide layer 18 on the bottom surface of the via hole 13 may be selectively removed by anisotropic etching, etc. Further, the TiN layer 15 on the bottom surface of the via hole 13 may be removed simultaneously with the removal of the Al oxide layer 18 on the bottom surface of the via hole 13.

Figure 2F:
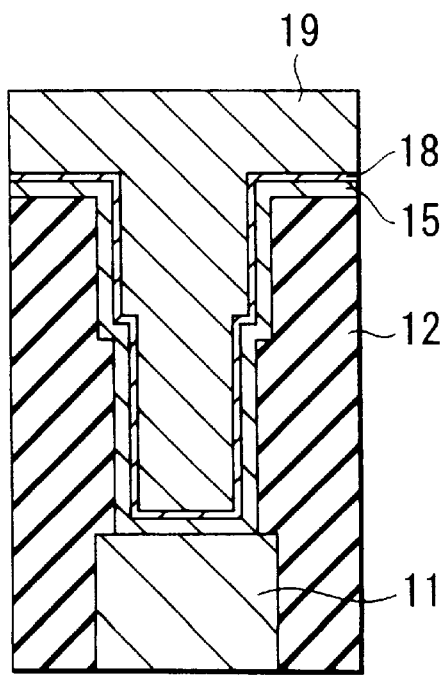

Then, as shown in FIG. 2F, Cu is deposited by the long throw sputtering method. Thereafter, Cu is reflowed by 15-minutes of annealing at 450° C., and the interconnection groove 14 and the via hole 13 are filled with Cu 19.

Figure 2G:
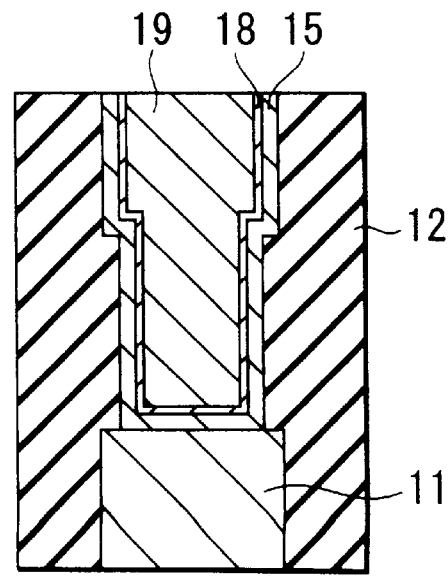

Thereafter, as shown in FIG. 2G, excessive Cu 19 and TiN layer 15 on the insulating layer 12 are removed by CMP, and a Cu damascene interconnection 19 is formed. In this CMP process, since the Al oxide layer 18 having an excellent adhesion to Cu has been formed between the Cu layer 19 and the TiN layer 15, no separation of film occurs, so that occurrence of a separation failure can be prevented.

According to the present method, since a dense and thin AlO$_x$ can be formed at the interface between the Cu damascene interconnection 19 and the TiN layer 15, the barrier properties of TiN layer 15 against Cu is improved. Further, since there is a high adhesion strength between Cu and AlO$_x$, CMP can be performed in good form, and occurrence of a failure due to separation of film can be suppressed.

Though the Al oxide layer 18 having a high resistivity is formed at the interface between the Cu damascene interconnection 19 and the underlying interconnection 11, an electric current runs upon a tunnel effect, since the layer 18 can be formed thin, and an increase of the electric resistance can be prevented. If an increase of the electric resistance comes at issue, it can be solved by selectively removing the Al oxide on the bottom of the via hole by anisotropic etching such as RIE.

Though Al and Ti were used as the first and second metal elements in the first embodiment, the metal elements to be used are not limited to them. Any metal elements can be used if the free energy of oxide formation of the two metal elements are different and the free energy of oxide formation of the second metal element is lower than that of the first metal element.

Further, though the long sputtering method was used as a method of depositing Cu in the first embodiment, another deposition method such as CVD, electroplating, electroless plating or a combination of the film-formation methods may be used. If there is no need to promote burying, no heating and annealing is required. Further, an interconnection material other than Cu can be used.

[Second Embodiment]

FIGS. 3A–3F are cross-sectional views showing stepwise a method of manufacturing an interconnection portion of a semiconductor device according to a second embodiment of the present invention.

Figure 3A:
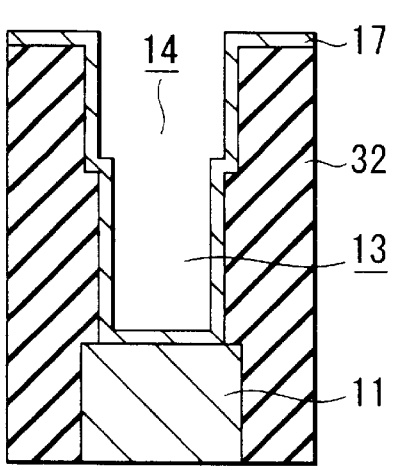
FIGS. 3A–3F are cross sectional views showing stepwise a method of manufacturing an interconnection portion of a semiconductor device relating to a second and a third embodiment of the present invention.

First, as shown in FIG. 3A, in an SiO$_x$ insulating layer (an oxide of a predetermined element) 32 formed to cover an interconnection 11, a via hole 13 to be connected to the underlying interconnection 11 and an interconnection groove 14 to be connected to the via hole 13 are formed. In FIGS. 3A–3F, though the interconnection 11 and the SiO$_x$ insulating layer 32 are formed on a semiconductor substrate on which circuit elements are formed, the circuit elements and the semiconductor layer are not shown. Then, an Al layer 17 having 10 nm thickness is deposited thereon by a long throw sputtering method. At this time, the Al layer 17 is formed under such conditions that the Al layer 17 covers inner walls and a bottom surface of the via hole 13 and the interconnection groove 14.

Figure 3B:
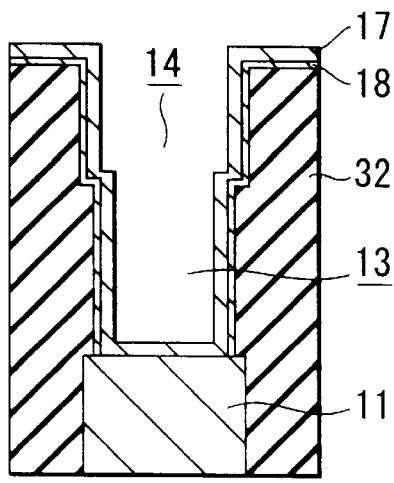

Next, as shown in FIG. 3B, the Al layer 17 and the SiO$_x$ insulating layer 32 are reacted with each other by performing vacuum annealing at 450° C. for 15 minutes, and an Al oxide (AlO$_x$) layer 18 having a thickness of 1–3 nm is formed at the interface between the Al layer 17 and the SiO$_x$ insulating layer 32. Since Al (metal element) has a free energy of oxide formation lower than that of Si (predetermined element), SiO$_x$ is reduced by Al during annealing, and an Al oxide is formed.

Figure 3C:
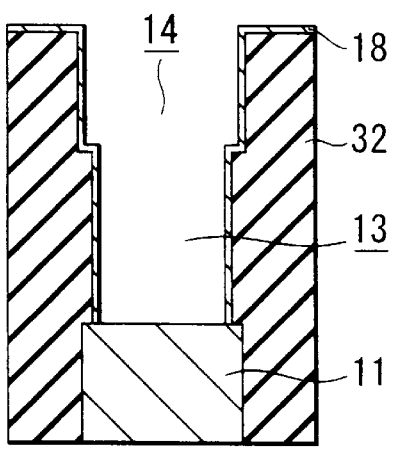

Then, as shown in FIG. 3C, the Al layer 17 remaining on the Al oxide layer 18 without being reacted is selectively removed by a wet-chemical solution mainly comprising phosphorous acid.

Figure 3D:
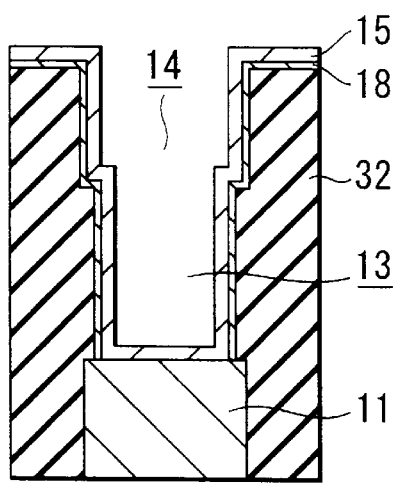

Thereafter, as shown in FIG. 3D, a TiN layer 15 having a thickness of 10 nm is deposited by the long throw sputtering method. Since Ti (a second metal element) has a free energy of oxide formation higher than that of Al (a first metal element), the Al oxide layer 18 is not reduced even if the TiN layer is heated later.

Figure 3E:
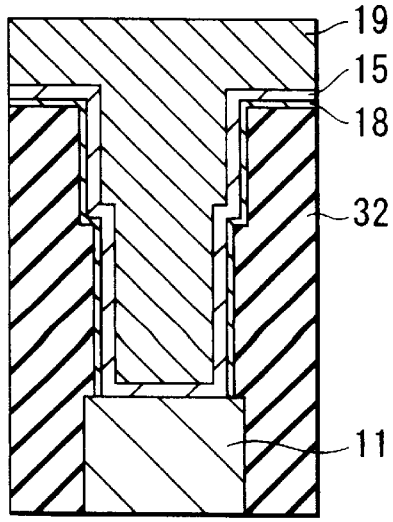

Further, as shown in FIG. 3E, Cu is successively deposited by the long throw sputtering method without being exposed to the atmospheric air. Thereafter, Cu is reflowed by 15-minutes annealing at 450° C., and the interconnection groove 14 and the via hole 13 are filled with Cu 19.

Figure 3F:
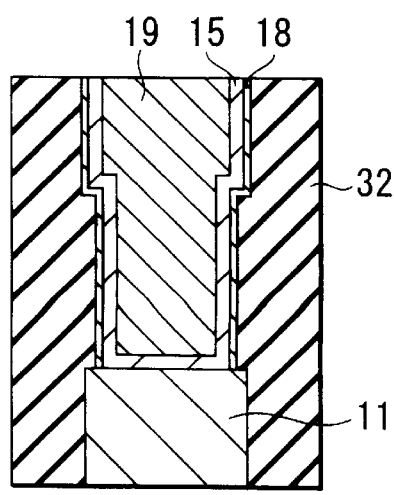

Then, as shown in FIG. 3F, excessive Cu 19 and TiN layer 15 on the SiO$_x$ insulating layer 32 are removed by CMP, and a Cu damascene interconnection 19 is formed.

According to the second embodiment, since the thin Al oxide layer 18 is formed at the interface between the SiO$_x$ insulating layer 32 and the TiN layer 15, barrier properties of the TiN layer 15 against the Cu damascene interconnection 19 is improved. Further, since the TiN layer 15 and the Cu layer 19 are deposited successively, the adhesion strength does not decrease, and CMP can be performed in good form. Since no Al oxide is formed at the interface between the Cu damascene interconnection 19 and the underlying interconnection 11, the electric resistance does not increase.

Though Al and Si were used as the metal element and the predetermined element in the second embodiment, the elements to be used are not limited to them. Any metal elements can be used if the free energy of oxide formation of the two elements are different and the free energy of oxide formation of the metal element is lower than that of the predetermined element.

Though a long throw sputtering method was used as a method for depositing the TiN layer 15 in the above embodiments, another deposition method can be used. For example, CVD such as MOCVD, wherein TDMAT (tetrakis (dimethylamino)-titanium) is used as a source gas, may be used. Though annealing (stuffing treatment) using a nitrogen atmosphere including a trace amount of oxygen was used as a method for forming the Ti oxide 16, another oxidation treatment such as atmospheric exposure and oxygen plasma treatment may be used. Furthermore, other than TiN, a conductive material comprising at least one of W, Ta and Nb, for example, a nitride of W, Ta or Nb, can be used.

Though the Al layer 17 was deposited in the second embodiment as well as the first embodiment, an Al alloy layer such as Al—Si and AlCu may be deposited instead of the Al layer. Though the long throw sputtering method was used in the embodiments as a method of depositing the Al layer 17, another deposition method such as CVD may be used. Further, though annealing was performed after deposition of the Al layer in order to promote the reduction, the layers may be heated when the Al layer is deposited. If the reaction sufficiently progresses in depositing the Al layer, heating or annealing is not particularly required. Furthermore, the Al layer remaining without being reacted was removed in the embodiments, the remaining layer does not necessarily have to be removed, unless the remaining Al is reacted with Cu and increases interconnection resistance.

With respect to a Cu deposition method, the same note as described in the first embodiment is applied to the second embodiment as well.

[Third Embodiment]

A manufacturing method of the third embodiment is basically same as that of the second embodiment. Therefore, FIGS. 3A–3F are referred to the third embodiment as well.

First, as shown in FIG. 3A, in an organic silicon oxide insulating layer (an insulating film containing carbon) 32 formed to cover an interconnection 11, a via hole 13 to be connected to the interconnection 11 and an interconnection groove 14 to be connected to the via hole 13 are formed. In FIGS. 3A–3F, though the interconnection 11 and the organic silicon oxide insulating layer 32 are formed on a semiconductor substrate on which circuit elements are formed, the circuit elements and the semiconductor layer are not shown. Then, a Ti layer 17 having 10 nm thickness is deposited thereon by a long throw sputtering method. At this time, the Ti layer 17 is formed under such conditions that the Ti layer 17 covers inner walls and a bottom surface of the via hole 13 and the interconnection groove 14.

Next, as shown in FIG. 3B, the Ti layer 17 and the organic silicon oxide insulating layer 32 are reacted with each other by performing vacuum annealing at 450° C. for 15 minutes, and a titanium carbide layer 18 having a thickness of 1–3 nm is formed at the interface between the Ti layer 17 and the organic silicon oxide insulating layer 32.

Then, as shown in FIG. 3C, the Ti layer 17 remaining on the titanium carbide layer 18 without being reacted is selectively removed by a wet-chemical solution mainly comprising dilute hydrofluoric acid.

Thereafter, as shown in FIG. 3D, a WN layer 15 having a thickness of 10 nm is deposited by the long throw sputtering method. Since W (a second metal element) has a free energy of carbide formation higher than that of Ti (a first metal element), the titanium carbide layer 18 is not reduced even if the titanium carbide layer is heated later.

Further, as shown in FIG. 3E, Cu is successively deposited by the long throw sputtering method without being exposed to the atmospheric air. Thereafter, Cu is reflowed by 15-minutes annealing at 450° C., and the interconnection groove 14 and the via hole 13 are filled with Cu 19.

Then, as shown in FIG. 3F, excessive Cu 19 and WN layer 15 and titanium carbide layer 18 on the organic silicon oxide insulating layer 32 are removed by CMP, and a Cu damascene interconnection 19 is formed.

According to the third embodiment, since the thin titanium carbide layer 18 is formed at the interface between the organic silicon oxide insulating layer 32 and the WN layer 15, barrier properties of the WN layer 15 against the Cu damascene interconnection 19 is improved. Further, since the WN layer 15 and the Cu layer 19 are deposited successively, the adhesion strength does not decrease, and CMP can be performed in good form. Since no titanium carbide is formed at the interface between the Cu damascene interconnection 19 and the underlying interconnection 11, the electric resistance of the contact does not increase.

Though Ti and W were used as the first and second metal elements in the third embodiment, the metal elements to be used are not limited to them. Any metal elements can be used if the free energy of carbide formation of the two metal elements are different and the free energy of carbide formation of the second metal element is lower than that of the first metal element.

Further, though organic silicon oxide was used as the insulating film containing carbon in the third embodiment, the present invention is not limited to this. Any insulating film can be used if it is an insulating film containing carbon, for example, an organic film.

Though a long throw sputtering method was used as a method for depositing the WN layer 15 in the above embodiments, another deposition method can be used. For example, CVD such as thermal CVD, wherein $WF_6$, $SiH_4$ and $NH_3$ are used as source gasses, may be used. Furthermore, other than WN, a conductive material comprising at least one of Ti, Ta and Nb, for example, a nitride of Ti, Ta or Nb, can be used.

Though the long throw sputtering method was used in the third embodiment as a method of depositing the Ti layer 17, another deposition method such as CVD may be used. Further, though annealing was performed after deposition of the Ti layer in order to promote the reduction, the layers may be heated when the Ti layer is deposited. If the reaction sufficiently progresses in depositing the Ti layer, heating or annealing is not particularly required. Furthermore, the Ti layer remaining without being reacted was removed in the third embodiment, the remaining layer does not necessarily have to be removed, unless there is a problem that the remaining Ti is reacted with Cu and increases interconnection resistance.

With respect to a Cu deposition method, the same note as described in the first embodiment is applied to the third embodiment as well.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming one of a groove and a hole in an insulating layer formed on a semiconductor substrate;
   forming a first conductive layer including at least a first metal element on a surface of the insulating layer;
   forming an oxide layer of the first metal element on a surface of the first conductive layer by exposing the first conductive layer to an oxidizing atmosphere;
   depositing on a surface of the oxide layer of the first metal element a second conductive layer including at least a second metal element having a free energy of oxide formation lower than that of the first metal element;
   forming an oxide layer of the second metal element at an interface between the first conductive layer and the second conductive layer by reducing the oxide layer of the first metal element by the second metal element; and
   burying an interconnection in the one of the groove and the hole in the insulating layer.

2. The method according to claim 1, further comprising selectively removing the second conductive layer, between the forming of the oxide layer of the second metal element and the burying of the interconnection in the one of the groove and the hole.

3. The method according to claim 1, further comprising removing the oxide layer of the second metal element formed on a bottom surface of one of the groove and the hole, while leaving the oxide layer of the second metal element formed on side surfaces of the one of the groove and the hole, between the forming of the oxide layer of the second metal element and the burying of the interconnection in the one of the groove and the hole.

4. The method according to claim 1, wherein the second metal element is Al.

5. The method according to claim 1, wherein the first metal element is an element selected from the group consisting of W, Ti, Ta and Nb, the first conductive layer is a nitride of the element selected from the group consisting of W, Ti, Ta and Nb, and the second metal element is Al.

6. The method according to claim 1, wherein the interconnection is a Cu interconnection.

7. A method of manufacturing a semiconductor device, comprising:
   forming one of a groove and a hole in an insulating layer formed on a semiconductor substrate, the insulating layer including an oxide of a predetermined element;
   forming on a surface of the insulating layer a first conductive layer including at least a first metal element having a free energy of oxide formation lower than that of the predetermined element;
   forming an oxide layer of the first metal element at an interface between the insulating layer and the first conductive layer, by reducing the oxide of the predetermined element by the first metal element;
   selectively removing the first conductive layer, after the forming of the oxide layer of the first metal element; and
   burying an interconnection in the one of the groove and the hole of the insulating layer, after the selectively removing of the first conductive layer.

8. The method according to claim 7, wherein the first metal element is Al.

9. The method according to claim 7, wherein the predetermined element is Si, and the first metal element is Al.

10. The method according to claim 7, further comprising depositing a second conductive layer including at least a second metal element having a free energy of oxide formation higher than that of the first metal element, between the selectively removing of the first conductive layer and the burying of the interconnection.

11. The method according to claim 7, wherein the interconnection is a Cu interconnection.

12. A method of manufacturing a semiconductor device, comprising:
   forming one of a groove and a hole in an insulating layer formed on a semiconductor substrate, the insulating layer including at least one element selected from the group consisting of boron, carbon and nitrogen;
   forming on a surface of the insulating layer a first conductive layer including at least a first metal element;
   forming a layer of one selected from the group consisting of boride, carbide and nitride of the first metal element at an interface between the insulating layer and the first conductive layer, by reacting the one element selected from the group consisting of boron, carbon and nitrogen with the first metal element; and
   burying an interconnection in the one of the groove and the hole of the insulating layer.

13. The method according to claim 12, further comprising selectively removing the first conductive layer, between the forming of a layer of one selected from the group consisting of boride, carbide and nitride of the first metal element and the burying of the interconnection.

14. The method according to claim 12, further comprising depositing a second conductive layer including at least a second metal element having a free energy of formation of the one selected from the group consisting of boride, oxide, carbide and nitride higher than that of the first metal element, between the forming of the layer of one selected from the group consisting of boride, carbide and nitride of the first metal element and the burying of the interconnection.

15. The method according to claim 12, wherein the interconnection is a Cu interconnection.

16. A method of manufacturing a semiconductor device, comprising:

forming one of a groove and a hole in an insulating layer formed on a semiconductor substrate, the insulating layer including an oxide of a predetermined element;

forming on a surface of the insulating layer a first conductive layer including at least a first metal element having a free energy of oxide formation lower than that of the predetermined element;

forming an oxide layer of the first metal element at an interface between the insulating layer and the first conductive layer, by reducing the oxide of the predetermined element by the first metal element;

depositing a second conductive layer including at least a second metal element having a free energy of oxide formation higher than that of the first metal element, after the forming of the oxide layer of the first metal element; and burying an interconnection in the one of the groove and the hole of the insulating layer, after the depositing of the second conductive layer.

17. The method according to claim 16, wherein the predetermined element is Si, the first metal element is Al, the second metal element is an element selected from the group consisting of W, Ti, Ta and Nb, and the second conductive layer is a nitride of the element selected from the group consisting of W, Ti, Ta, and Nb.

18. The method according to claim 16, further comprising selectively removing the first conductive layer, between the forming of the oxide layer of the first metal element and the depositing of the second conductive layer.

19. The method according to claim 16, wherein the first metal element is Al.

20. The method according to claim 16, wherein the predetermined element is Si, and the first metal element is Al.

21. The method according to claim 16, wherein the interconnection is a Cu interconnection.

* * * * *